United States Patent
Yao et al.

(10) Patent No.: US 9,425,152 B2
(45) Date of Patent: Aug. 23, 2016

(54) METHOD FOR FABRICATING EMI SHIELDING PACKAGE STRUCTURE

(71) Applicant: Siliconware Precision Industries Co., Ltd., Taichung (TW)

(72) Inventors: Chin-Tsai Yao, Taichung (TW); Chien-Ping Huang, Taichung (TW); Chun-Chi Ke, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/622,255

(22) Filed: Feb. 13, 2015

(65) Prior Publication Data

US 2015/0155240 A1  Jun. 4, 2015

Related U.S. Application Data

(62) Division of application No. 12/769,053, filed on Apr. 28, 2010, now Pat. No. 8,963,298.

(30) Foreign Application Priority Data

Jan. 18, 2010 (TW) .............................. 99101178 A

(51) Int. Cl.
*H01L 23/552* (2006.01)
*H01L 23/00* (2006.01)
(Continued)

(52) U.S. Cl.
CPC ........... *H01L 23/552* (2013.01); *H01L 21/561* (2013.01); *H01L 21/78* (2013.01); *H01L 24/81* (2013.01); *H01L 24/85* (2013.01); *H01L 24/96* (2013.01); *H01L 24/97* (2013.01); *H01L 2224/48091* (2013.01); *H01L 2224/48106* (2013.01); *H01L 2224/48227* (2013.01); *H01L 2224/48247* (2013.01); *H01L 2224/85* (2013.01); *H01L 2224/97* (2013.01); *H01L 2924/00014* (2013.01); *H01L 2924/0105* (2013.01); *H01L 2924/01006* (2013.01);
(Continued)

(58) Field of Classification Search
CPC ... H01L 21/568; H01L 23/29; H01L 21/561; H01L 21/4832
See application file for complete search history.

(56) References Cited

U.S. PATENT DOCUMENTS 4,218,578 A   8/1980   Olschewski et al.
4,838,475 A   6/1989   Mullins et al.
(Continued)

*Primary Examiner* — Jerome Jackson, Jr.
*Assistant Examiner* — Fang-Xing Jiang
(74) *Attorney, Agent, or Firm* — Mintz Levin Cohn Ferris Glovsky and Popeo, P.C.; Peter F. Corless; Steven M. Jensen

(57) ABSTRACT

An EMI shielding package structure includes a substrate unit having a first surface with a die mounting area and a second surfaces opposite to the first surface, metallic pillars formed on the first surface, a chip mounted on and electrically connected to the die-mounting area, an encapsulant covering the chip and the first surface while exposing a portion of each of the metallic pillars from the encapsulant, and a shielding film enclosing the encapsulant and electrically connecting to the metallic pillars. A fabrication method of the above structure by two cutting processes is further provided. The first cutting process forms grooves by cutting the encapsulant. After a shielding film is formed in the grooves and electrically connected to the metallic pillars, the complete package structure is formed by the second cutting process, thereby simplifying the fabrication process while overcoming inferior grounding of the shielding film as encountered in prior techniques.

9 Claims, 6 Drawing Sheets

(51) Int. Cl.
*H01L 21/56* (2006.01)
*H01L 21/78* (2006.01)

(52) U.S. Cl.
CPC ............... *H01L 2924/01029* (2013.01); *H01L 2924/01079* (2013.01); *H01L 2924/15311* (2013.01); *H01L 2924/181* (2013.01); *H01L 2924/3025* (2013.01)

(56) References Cited

U.S. PATENT DOCUMENTS

| | | | |
|---|---|---|---|
| 4,953,002 A | 8/1990 | Nelson et al. | |
| 5,030,935 A | 7/1991 | Williams et al. | |
| 5,166,772 A | 11/1992 | Soldner et al. | |
| 5,220,489 A | 6/1993 | Barreto et al. | |
| 5,311,059 A | 5/1994 | Banerji et al. | |
| 5,557,142 A | 9/1996 | Gilmore et al. | |
| 5,679,975 A | 10/1997 | Wyland et al. | |
| 7,030,469 B2 | 4/2006 | Mahadevan et al. | |
| 7,342,303 B1 | 3/2008 | Berry et al. | |
| 8,030,750 B2 | 10/2011 | Kim et al. | |
| 8,093,690 B2 | 1/2012 | Ko et al. | |
| 8,110,902 B2 | 2/2012 | Eun et al. | |
| 2006/0145361 A1* | 7/2006 | Yang | H01L 23/29 257/787 |
| 2008/0308912 A1* | 12/2008 | Cha | H01L 23/29 257/659 |
| 2009/0194851 A1* | 8/2009 | Chiu | H01L 21/568 257/660 |
| 2009/0194852 A1* | 8/2009 | Chiu | H01L 21/568 257/660 |
| 2012/0052630 A1* | 3/2012 | Lin | H01L 21/561 438/108 |
| 2012/0241922 A1* | 9/2012 | Pagaila | H01L 21/4832 257/659 |

\* cited by examiner

FIG. 3A"

METHOD FOR FABRICATING EMI SHIELDING PACKAGE STRUCTURE

CROSS-REFERENCE TO RELATED APPLICATIONS

This application is a divisional of copending application U.S. Ser. No. 12/769,053, filed on Apr. 28, 2010, which claims under 35 U.S.C. §119(a) the benefit of Taiwanese Application No. 099101178, filed Jan. 18, 2010, the entire contents of which are incorporated herein by reference.

BACKGROUND OF THE INVENTION

1. Field of the Invention

The present invention relates to package structures and fabrication methods thereof, and more particularly, to an electromagnetic interference (EMI) shielding package structure and a fabrication method thereof.

2. Description of Related Art

For the purpose of fabrication of a semiconductor package, a semiconductor chip is electrically connected to a carrier such as a lead frame or a substrate, and an encapsulant made of epoxy resin is formed to encapsulate the semiconductor chip and the carrier, thereby protecting the semiconductor chip and the carrier against intrusion of external moisture or contaminants.

However, a semiconductor package in operation can easily be influenced by electromagnetic interference (EMI), thereby causing abnormal operation and poor electrical performance of the semiconductor package.

Accordingly, U.S. Pat. No. 5,166,772 discloses a structure with a metal shield embedded in the encapsulant thereof.

FIG. 1 is a cutaway view of the structure. Referring to FIG. 1, a chip 11 is disposed on a substrate 10 and electrically connected to the substrate 10 through a plurality of bonding wires 12, wherein the substrate 10 has at least a ground terminal 14, a perforated metal shield 13 is disposed to cover the chip 11 and electrically connected to the ground terminal 14, and an encapsulant 15 is formed to cover the metal shield 13, the chip 11, the bonding wires 12 and a portion of the substrate 10, thereby embedding the metal shield 13 in the encapsulant 15. The metal shield 13 shields the chip 11 from external EMI so as to improve electrical performance of the overall structure. Similar structures are also disclosed in U.S. Pat. No. 4,218,578, No. 4,838,475, No. 4,953,002 and No. 5,030,935.

However, since an additionally fabricated metal shield 13 is required in the above-described structure, the fabrication process of the structure is complicated. Further, the metal shield 13 that is required to cover the chip 11 and fixed to the substrate 10 increases the assembly difficulty. Furthermore, after the metal shield 13 is disposed on the substrate 10 to cover the chip 11, the encapsulant 15 must pass through the metal shield 13 for encapsulating the chip 11. Since the metal shield 13 is perforated, when the encapsulant 15 passes through the metal shield 13, turbulence can easily occur in the encapsulant, thus resulting in generation of air bubbles in the encapsulant and causing a popcorn effect in a subsequent thermal processing.

FIG. 2 is a cutaway view of a structure disclosed by U.S. Pat. No. 5,557,142. Referring to FIG. 2, a chip 21 is mounted on a substrate 20 and electrically connected to the substrate 20 through a plurality of bonding wires 22. Further, an encapsulant 23 is formed to encapsulate the chip 21, the bonding wires 22 and a portion of the substrate 20, and a metal layer 24 is formed on the exposed surface of the encapsulant 23 through coating or sputtering so as to shield the package structure from EMI. Similar structures are also disclosed in U.S. Pat. No. 5,220,489, No. 5,311,059 and No. 7,342,303.

Although the above conventional structure dispenses with complicated processes, the metal layer 24 must be formed by coating or sputtering after a singulation process, and it is difficult to perform component arrangement and pickup in a singulated package structure; hence, the above conventional structure is not suitable for mass production. In addition, the sputtering process cannot be applied in a package structure in which the encapsulant is flush with the sides of the substrate.

In a package structure disclosed by U.S. Pat. No. 7,030,469, a groove is formed on an encapsulant to expose bonding wires, and a conductive layer electrically connected to the bonding wires is formed in the groove and on the encapsulant, thereby achieving a shielding effect. However, the conductive layer must be made of a non-ferrous metal material and can only be formed on the groove and encapsulant by depositing or sputtering. Therefore, it cannot be applied in a package structure in which the encapsulant is flush with the sides of substrate. Further, the contact between the conductive layer and the bonding wires is point contact, which can easily result in poor electrical connection between the conductive layer and the bonding wires.

Therefore, it is imperative to overcome the above drawbacks of the prior art.

SUMMARY OF THE INVENTION

In view of the above drawbacks of the prior art, the present invention provides an EMI shielding package structure, which comprises: a substrate unit having a first surface with a die mounting area and a second surface opposite to the first surface; a plurality of metallic pillars disposed on the first surface; a chip mounted on and electrically connected to the die mounting area; an encapsulant covering the chip and the first surface of the substrate unit and exposing a portion of each of the metallic pillars from the encapsulant; and a shielding film encapsulating the encapsulant and electrically connecting to the metallic pillars.

The present invention further discloses a fabrication method of an EMI shielding package structure, which comprises: preparing a substrate defined thereon with a plurality of longitudinal and transverse cutting lines for demarcating the substrate into a plurality of substrate units, wherein the substrate units each have a first surface with a die mounting area and a second surface opposite to the first surface; forming a plurality of metallic pillars along at least one of the cutting lines at the periphery of each of the substrate units; mounting and electrically connecting a chip to the die mounting area of each of the substrate units; forming an encapsulant on the substrate to encapsulate the chips and the metallic pillars; performing a first cutting process on and along the cutting lines for cutting the encapsulant and the metallic pillars so as to form a plurality of grooves in the encapsulant with the metallic pillars exposed therefrom; forming a shielding film on the encapsulant and in the grooves and electrically connected to the metallic pillars; and performing a second cutting process on and along the cutting lines for cutting the shielding film and the substrate such that the shielding film encloses the sides of the encapsulant and is flush with the sides of the substrate.

Therein, the metallic pillars can be disposed along the transverse cutting lines or longitudinal cutting lines. The metallic pillars can also be disposed at the intersection points of the transverse cutting lines and the longitudinal cutting lines. In an embodiment, a portion of the metallic pillars are disposed at the intersection points of the cutting lines and another portion of the metallic pillars are disposed along the cutting lines at positions other than the intersection points.

In an embodiment, the metallic pillars are made of Cu, Sn or Au. Each of the chips has an active surface and an opposite inactive surface. A plurality of signal pads, power pads and ground pads are formed on the active surface of each of the chips and electrically connected to a corresponding one of the substrate units through wire bonding or in a flip-chip manner.

The cutting depth for the first cutting process can be greater than, equal to or less than the thickness of the encapsulant. The cutting width for the second cutting process is less than the width of the grooves such that the shielding film covers the sides of the encapsulant.

The shielding film can be made of a carbon-based material or a metallic powder-containing material. The shielding film can be formed on the encapsulant and in the grooves by screen printing, and then curing is performed. Another embodiment involves dropping a liquid-state carbon-based material or a metal powder-containing material into the grooves so as to form a first shielding film therein, forming a second shielding film on the encapsulant and on the first shielding film in the grooves by screen printing, and curing the first shielding film and the second shielding film.

The second surface of the substrate unit can further comprise a plurality of solder balls.

According to the present invention, a substrate is provided, and a plurality of cutting lines is defined thereon for demarcating the substrate into a plurality of substrate units each having a first surface defined thereon with a die mounting area. A plurality of metallic pillars is formed along the cutting lines. A chip is mounted on the die mounting area of each of the substrate units. An encapsulant is formed on the substrate to encapsulate the chips and the metallic pillars, and the encapsulant and the metallic pillars are then cut along the cutting lines to form a plurality of grooves in the encapsulant with the side surfaces of the metallic pillars exposed therefrom. Further, a shielding film is formed on the encapsulant and in the grooves, and the shielding film and the substrate are cut such that the shielding film covers the sides of the encapsulant. Since the shielding film is in surface contact with the metallic pillars, the present invention overcomes the conventional drawback of poor grounding quality caused by point contact as disclosed in U.S. Pat. No. 7,030,469. The present invention further overcomes the conventional drawbacks of complicated fabrication processes, assembly difficulty and popcorn effects during a thermal process, and facilitates the mass production.

BRIEF DESCRIPTION OF DRAWINGS

FIG. 3A' is a cross-sectional view for FIG. 3A;

FIG. 3A" is a top view showing another embodiment of the method as depicted in FIG. 3A according to the present invention;

FIGS. 3D-1, 3D-2, 3E, and 3F are cross-sectional views showing another embodiment of the method as depicted in FIG. 3D according to the present invention; and FIGS. 3F-1, 3F-2, and 3F-3 show EMI shielding package structures in other embodiments of the present invention.

DETAILED DESCRIPTION OF PREFERRED EMBODIMENTS

The following specific embodiments are provided to illustrate the disclosure of the present invention, these and other advantages and effects can be apparent to those in the art after reading this specification.

FIGS. 3A to 3F-3 show a fabrication method of an electromagnetic interference (EMI) shielding package structure according to the present invention.

Figure 3A:
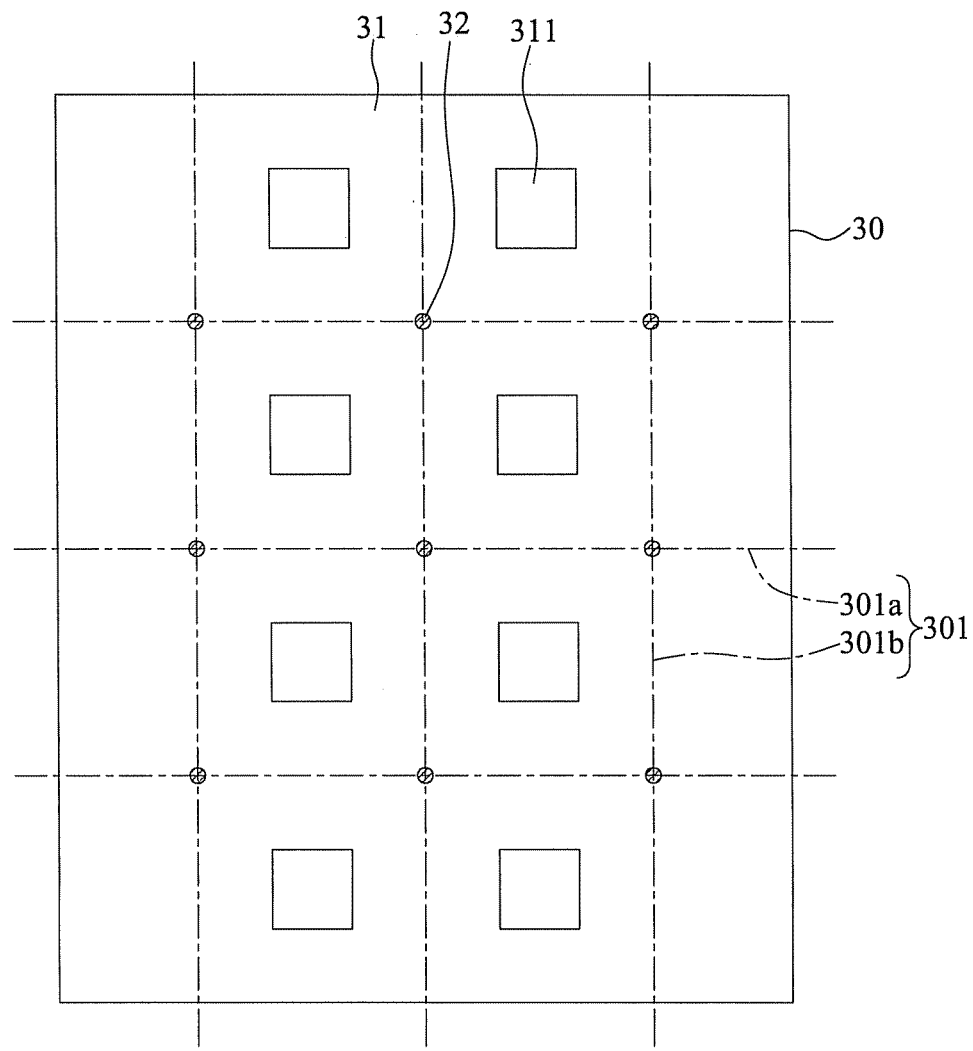
FIG. 3A is a top view of a fabrication method of an EMI shielding package structure according to the present invention.
Figure 3A:
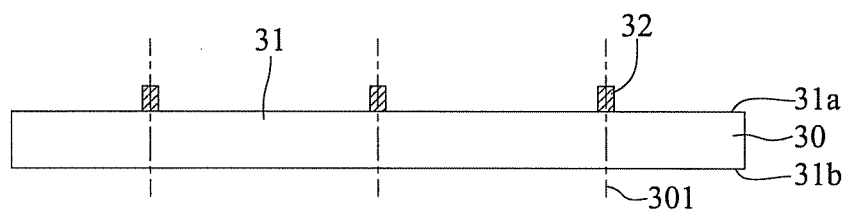

Referring to FIGS. 3A and 3A', wherein FIG. 3A is a top view of FIG. 3A', a substrate 30 is prepared, and a plurality of cutting lines 301 is defined on the substrate 30. The cutting lines 301 comprise a plurality of transverse cutting lines 301$a$ and a plurality of longitudinal cutting lines 301$b$. The transverse cutting lines 301$a$ and the longitudinal cutting lines 301$b$ together demarcate the substrate 30 into a plurality of substrate units 31. Each of the substrate units 31 has a first surface 31$a$ defined thereon with a die mounting area 311 and a second surface 31$b$ opposite to the first surface 31$a$.

A plurality of metallic pillars 32 made of Cu, Sn or Au is formed along at least one of the cutting lines 301 at the periphery of each of the substrate units 31 for electrical connection with a ground terminal or a ground layer (not shown) of the corresponding substrate unit 31. The metallic pillars 32 can be disposed along the transverse cutting lines 301$a$, along the longitudinal cutting lines 301$b$, or at intersection points of the transverse cutting lines 301$a$ and the longitudinal cutting lines 301$b$. In another embodiment shown in FIG. 3A", a portion of the metallic pillars 32 are disposed at the intersection points of the cutting lines and another portion of the metallic pillars 32 are disposed along the cutting lines at positions other than the intersection points.

Figure 3B:
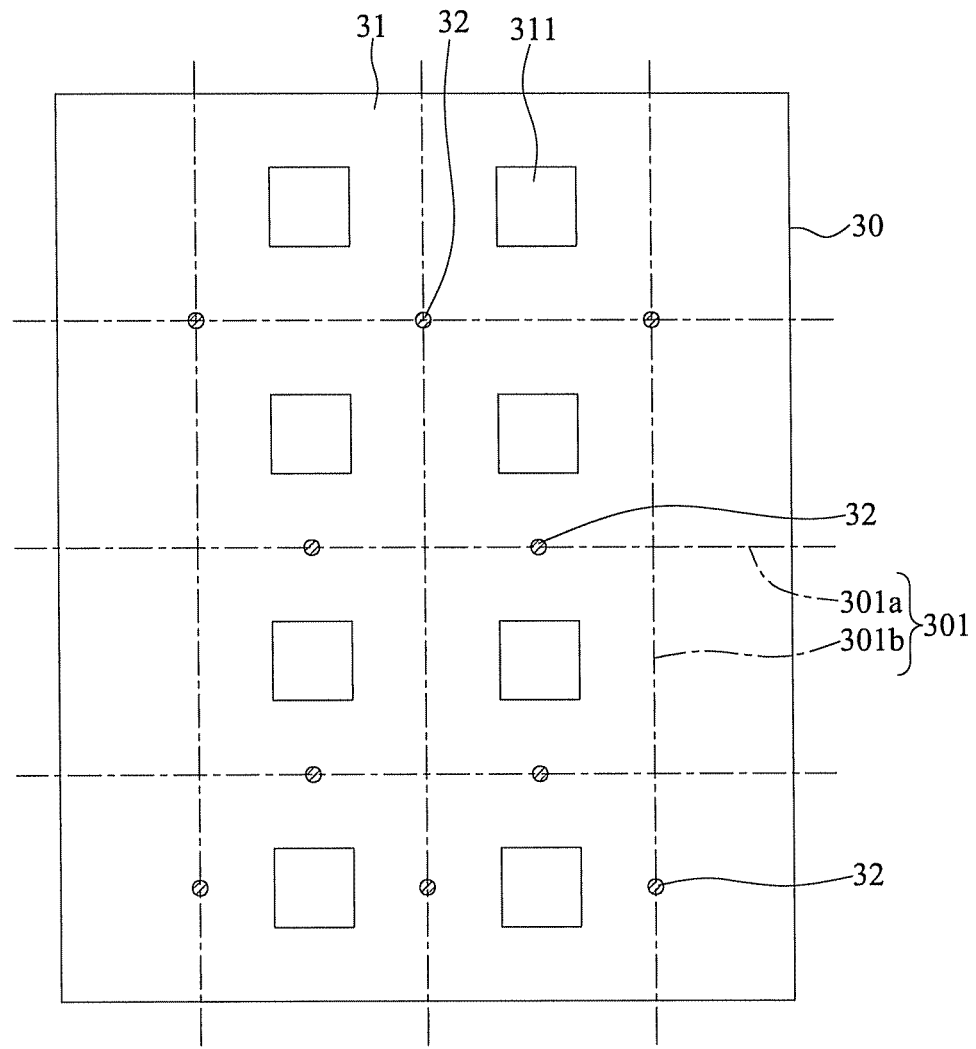
FIGS. 3B, 3C, and 3D are cross-sectional views of the method as depicted in FIG. 3A according to the present invention.
Figure 3B:
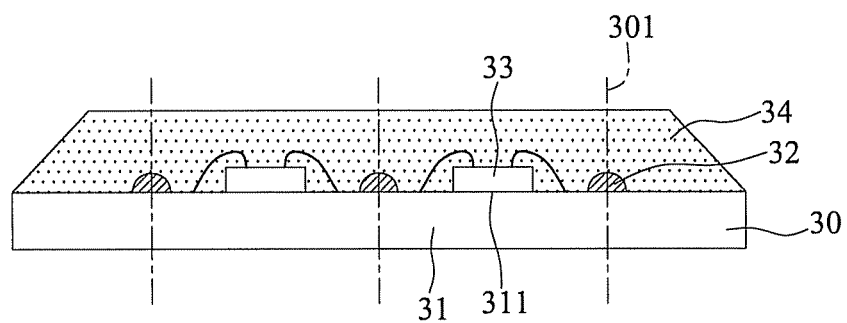

Referring to FIG. 3B, a chip 33 is mounted on and electrically connected to the die mounting area 311 of each of the substrate units 31. The chip 33 has an active surface and an opposite inactive surface. A plurality of signal pads, power pads, and ground pads are formed on the active surface of the chip 33 and electrically connected to a corresponding one of the substrate units 31 by wiring bonding, as in the present embodiment, or in a flip-chip manner.

Then, an encapsulant 34 is formed on the substrate 30 to encapsulate the chips 33 and the metallic pillars 32.

Figure 3C:
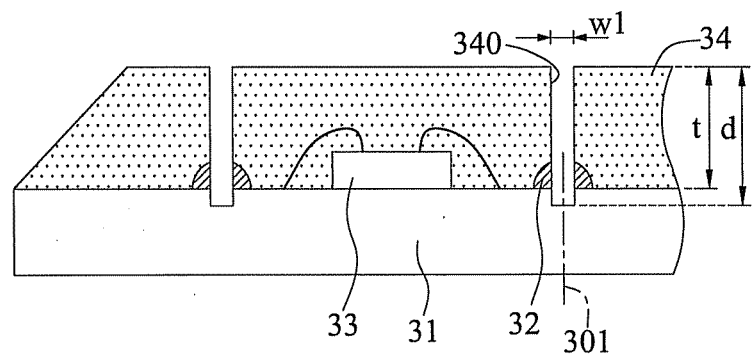

Referring to FIG. 3C, a first cutting process is performed on and along the cutting lines 301 for cutting the encapsulant 34 and the metallic pillars 32 so as to form a plurality of grooves 340 in the encapsulant 34 with the metallic pillars 32 exposed therefrom, respectively. The cutting depth d of the first cutting process can be greater than, equal to or less than the thickness t of the encapsulant 34.

Figure 3D:
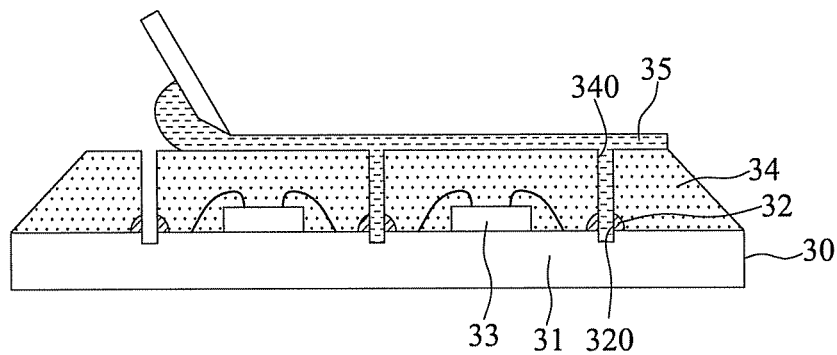
Figures 1, 3D:
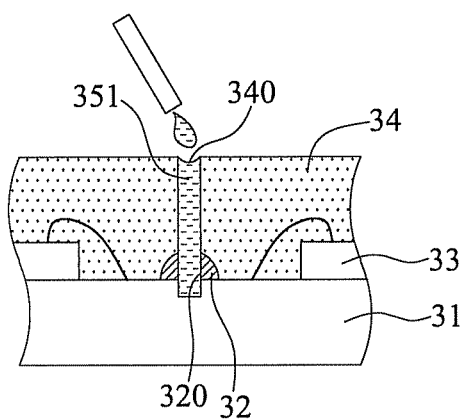
Figures 2, 3D:
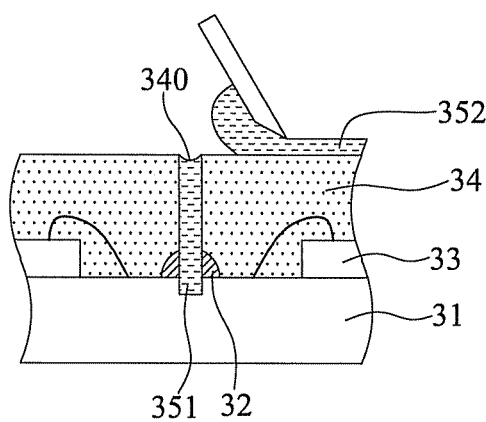

Referring to FIG. 3D, a shielding film 35 made of a carbon-based material or a metal powder-containing material is formed by screen printing on the encapsulant 34 and in the grooves 340, and then curing is performed. The shielding film 35 is electrically connected to the side surfaces 320 of the metallic pillars 32. The shielding film 35 protects the chip 33 against electromagnetic interference (EMI), thereby ensuring normal operation of the chip 33.

Figure 1:
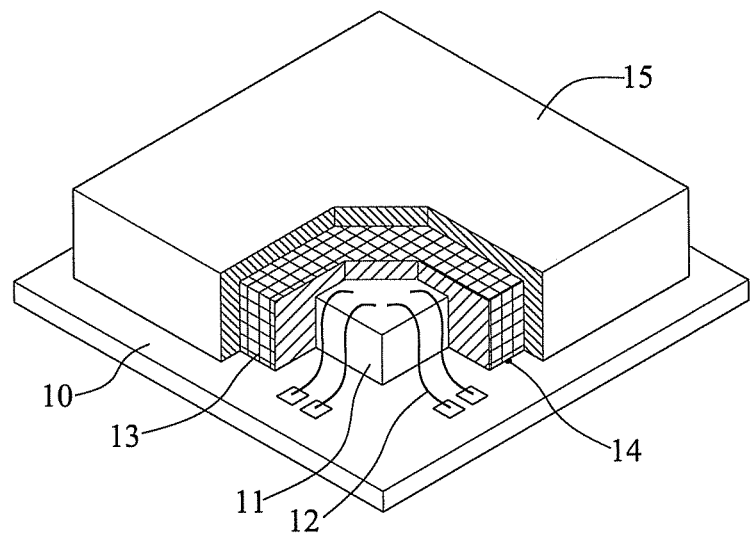
FIG. 1 is a cutaway view of a package structure disclosed by U.S. Pat. No. 5,166,772.
Figure 2:
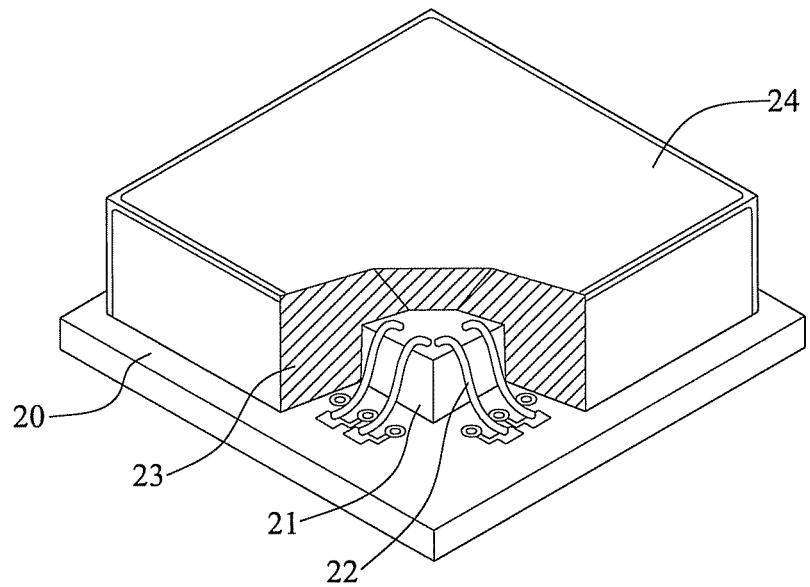
FIG. 2 is a cutaway view of a package structure disclosed by U.S. Pat. No. 5,557,142.

FIGS. 3D-1 and 3D-2 show another embodiment of the method for forming the shielding film 35. Unlike the previous embodiment, the present embodiment involves dropping a liquid-state carbon-based material or metal powder-containing material into the grooves 340 so as to form a first shielding film 351 therein as shown in FIG. 3D-1, forming a second shielding material 352 on an exposed surface of the encapsulant 34 and on the first shielding film 351 in the grooves 340 as shown in FIG. 3D-2, and curing the first shielding film 351 and the second shielding film 352.

Figure 3E:
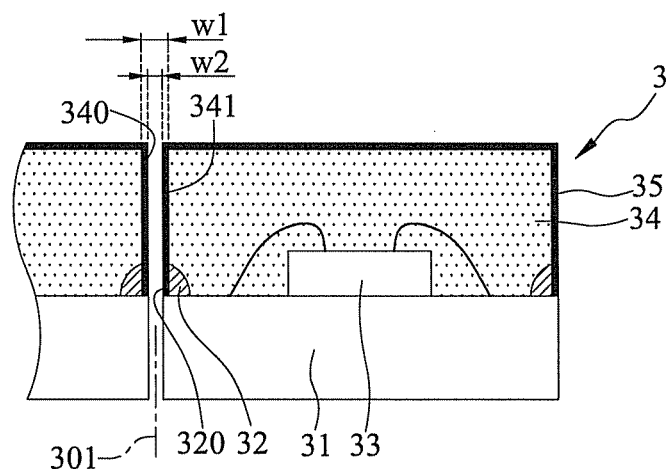

Referring to FIG. 3E, a second cutting process is performed on and along the cutting lines 301 for cutting the shielding film 35 in the grooves 340 and the substrate 30. The cutting width w2 of the second cutting process is less than the width w1 of the grooves 340 or the first cutting process; hence, the shielding film 35 encloses the sides of the encapsulant 34 and is flush with the sides of the substrate 30.

Figure 3F:
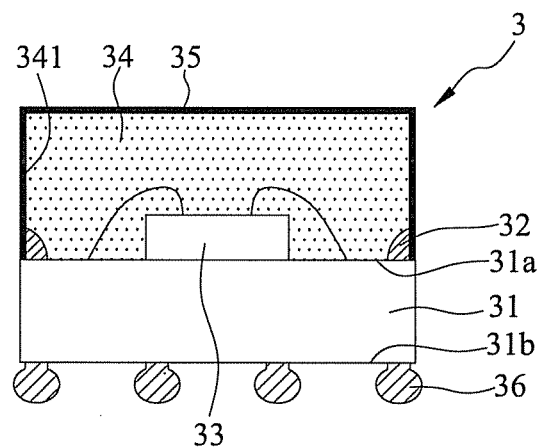
Figures 1, 3F:
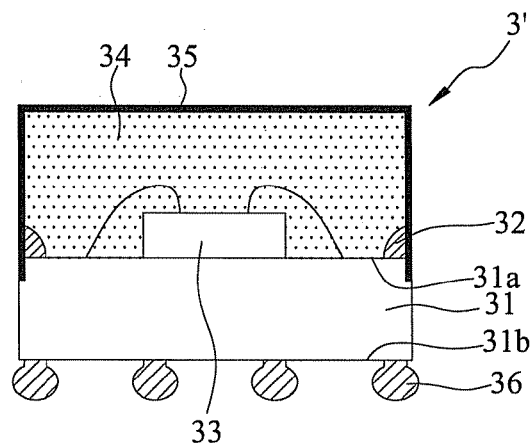
Figures 2, 3F:
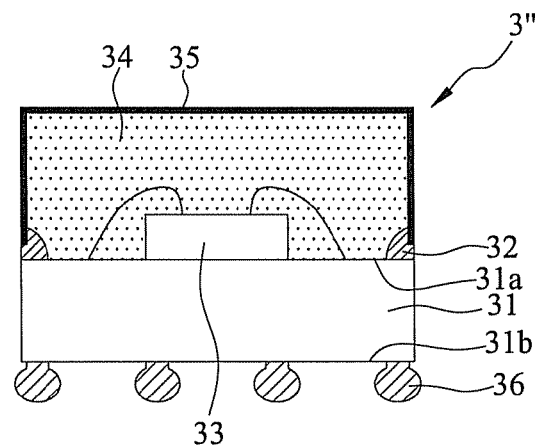

Referring to FIG. 3F, a plurality of solder balls 36 is further formed on the second surface 31b of each of the substrate units 31 for electrical connection with an electronic device.

According to the above fabrication method, the present invention further provides an EMI shielding package structure 3, which comprises: a substrate unit 31 having a first surface 31a defined thereon with a die mounting area 311 and a second surface 31b opposite to the first surface 31a; a plurality of metallic pillars 32 disposed on the first surface 31a, wherein the metal pillars 32 can be made of Cu, Sn or Au; a chip 33 having an active surface provided with a plurality of signal pads, power pads, and ground pads, and an inactive surface opposite to the active surface, wherein the signal pads, power pads and ground pads are electrically connected to the substrate unit 31 through wire bonding or in a flip-chip manner; an encapsulant 34 covering the chip 33 and the first surface 31a of the substrate unit 31, wherein a portion of each of the metallic pillars 32 is exposed from the encapsulant 34; and a shielding film 35 enclosing the encapsulant 34 and electrically connecting to the metallic pillars 32, wherein the shielding film 35 can be made of a carbon-based material or a metallic powder-containing material. Referring to the drawings, in the present embodiment, the cutting depth d for the first cutting process is equal to the thickness t of the encapsulant 34; hence, the shielding film 35 encloses the metallic pillars 32 and is flush with the sides of the substrate 30.

The EMI shielding package structure further comprises a plurality of solder balls 36 disposed on the second surface 31b of the substrate unit 31 for electrical connection with an electronic device.

FIG. 3F-1 shows an EMI shielding package structure 3' according to another embodiment of the present invention. Different from the above-described embodiment, the cutting depth d for the first cutting process in the present embodiment is greater than the thickness t of the encapsulant 34. Therefore, the shielding film 35 encloses the metallic pillars 32 and a portion of the substrate 30, and is flush with the sides of the substrate 30.

FIG. 3F-2 shows an EMI shielding package structure 3" according to another embodiment of the present invention. Different from the above-described embodiments, the cutting depth d for the first cutting process in the present embodiment is less than the thickness t of the encapsulant 34. Therefore, the shielding film 35 only encloses a portion of the metallic pillars 32, and is flush with the sides of the metallic pillars 32 and the substrate 30.

Figures 3, 3F:
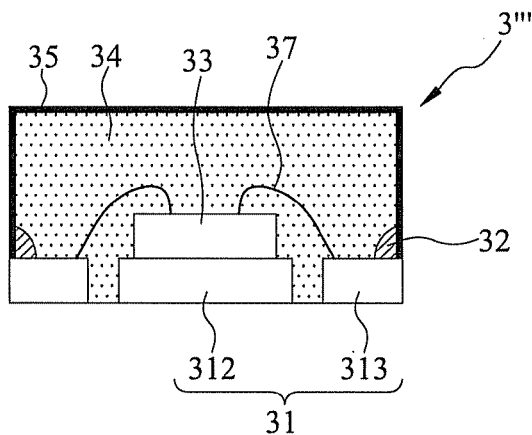

FIG. 3F-3 shows an EMI shielding package structure 3''' according to another embodiment of the present invention. Different from the above-described embodiments, the substrate unit 31 of the present embodiment is a lead frame that has a die pad 312 and a plurality of leads 313. The package structure 3" further comprises metallic pillars 32 disposed on the leads 313 and a chip 33 mounted on the die pad 312 and electrically connected to the leads 313 through bonding wires 37; an encapsulant 34 encapsulating the chip 33 and the lead frame, wherein a portion of each of the metallic pillars 32 is exposed from the encapsulant 34; and a shielding film 35 enclosing the encapsulant 34 and electrically connecting to the metallic pillars 32.

According to the present invention, a substrate is provided, and a plurality of cutting lines is defined on the substrate. The cutting lines demarcate the substrate into a plurality of substrate units. A plurality of metallic pillars is formed along the cutting lines. A chip is mounted on a die mounting area of each of the substrate units. An encapsulant is formed on the substrate to encapsulate the chips and the metallic pillars. The encapsulant and the metallic pillars are cut along the cutting lines to form a plurality of grooves in the encapsulant with the side surfaces of the metallic pillars exposed therefrom. Further, a shielding film is formed on the encapsulant and in the grooves. The shielding film and the substrate are cut such that the shielding film covers the sides of the encapsulant. Since the shielding film is in surface contact with the metallic pillars, the grounding quality is improved in the present invention. Further, the present invention overcomes the conventional drawbacks of complicated fabrication processes, assembly difficulty and popcorn effects during a thermal process, and facilitates mass production.

The above-described descriptions of the detailed embodiments are intended to illustrate the preferred implementation according to the present invention, but are not intended to limit the scope of the present invention. Accordingly, all modifications and variations completed by those with ordinary skill in the art should fall within the scope of present invention defined by the appended claims.

What is claimed is:

1. A fabrication method of an EMI shielding package structure, comprising the steps of:
preparing a substrate defined thereon with a plurality of longitudinal and transverse cutting lines for demarcating the substrate into a plurality of substrate units each having a first surface defined thereon with a die mounting area and a second surface opposite to the first surface;
forming a plurality of metallic pillars along at least one of the cutting lines at a periphery of each of the substrate units;
mounting and electrically connecting a chip to the die mounting area of each of the substrate units;
forming an encapsulant on the substrate to encapsulate the chips and the metallic pillars;
performing a first cutting process for cutting the encapsulant and the metallic pillars along the cutting lines so as to form a plurality of grooves in the encapsulant with the metallic pillars exposed therefrom;
forming a shielding film on the encapsulant and in the grooves, so as for the shielding film to be electrically connected to the metallic pillars, wherein the step of forming the shielding film comprises the sub-steps of:

dropping a liquid-state carbon-based material or a metal powder-containing material into the grooves so as to form a first shielding film therein;

forming a second shielding film on an exposed surface of the encapsulant and on the first shielding film in the grooves by screen printing; and curing the first shielding film and the second shielding film; and performing a second cutting process for cutting the shielding film and the substrate along the cutting lines such that the shielding film encloses sides of the encapsulant and is flush with sides of the substrate.

2. The method of claim 1, wherein the metallic pillars are disposed along the transverse cutting lines or the longitudinal cutting lines.

3. The method of claim 1, wherein the metallic pillars are disposed at intersection points of the transverse cutting lines and the longitudinal cutting lines.

4. The method of claim 1, wherein the metallic pillars are made of Cu, Sn or Au.

5. The method of claim 1, wherein each of the chips is electrically connected to a corresponding one of the substrate unit through wire bonding or in a flip-chip manner.

6. The method of claim 1, wherein a depth of cutting for the first cutting process is greater than, equal to, or less than a thickness of the encapsulant.

7. The method of claim 1, wherein a width of cutting for the second cutting process is less than a width of the grooves.

8. The method of claim 1, wherein the shielding film is made of a carbon-based material or a metal powder-containing material.

9. The method of claim 1, wherein the shielding film is formed on an exposed surface of the encapsulant and in the grooves by screen printing, and then curing is performed.

* * * * *